(12) United States Patent
Yamamoto et al.

(10) Patent No.: US 7,304,542 B2
(45) Date of Patent: Dec. 4, 2007

(54) PHOTO-RECEIVING AMPLIFIER ELEMENT, OPTICAL PICKUP UNIT, AND OPTICAL DISK DEVICE

(75) Inventors: Motohiko Yamamoto, Nara (JP); Takanori Okuda, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 179 days.

(21) Appl. No.: 11/180,710

(22) Filed: Jul. 14, 2005

(65) Prior Publication Data

US 2006/0011815 A1 Jan. 19, 2006

(30) Foreign Application Priority Data

Jul. 14, 2004 (JP) ............................. 2004-210041

(51) Int. Cl.
*H03F 3/08* (2006.01)

(52) U.S. Cl. .................... 330/308; 250/214 A

(58) Field of Classification Search ................. 330/59, 330/110, 308; 250/214 A, 214 AG; 257/537, 257/538
See application file for complete search history.

(56) References Cited

U.S. PATENT DOCUMENTS 4,079,337 A * 3/1978 Lundgren et al. ........... 338/308
5,592,124 A * 1/1997 Mullins et al. ............. 330/308

FOREIGN PATENT DOCUMENTS

JP 2000-315922 11/2000
JP 2002-261549 9/2002

* cited by examiner

*Primary Examiner*—Khanh Van Nguyen
(74) *Attorney, Agent, or Firm*—Birch, Stewart, Kolasch & Birch, LLP

(57) ABSTRACT

A feedback resistor of a feedback circuit included in a photo-receiving amplifier element is formed on an island region in which an electric potential is in a floating state. The island region is electrically isolated from an island region on which an element other than the feedback resistor is formed. This enables the response speed of the photo-receiving amplifier element to be increased without changing the process of the circuit or varying a resistance value of the feedback resistor in a first-stage amplifier unit.

17 Claims, 9 Drawing Sheets

FIG. 2 (a)
FIG. 2 (b)
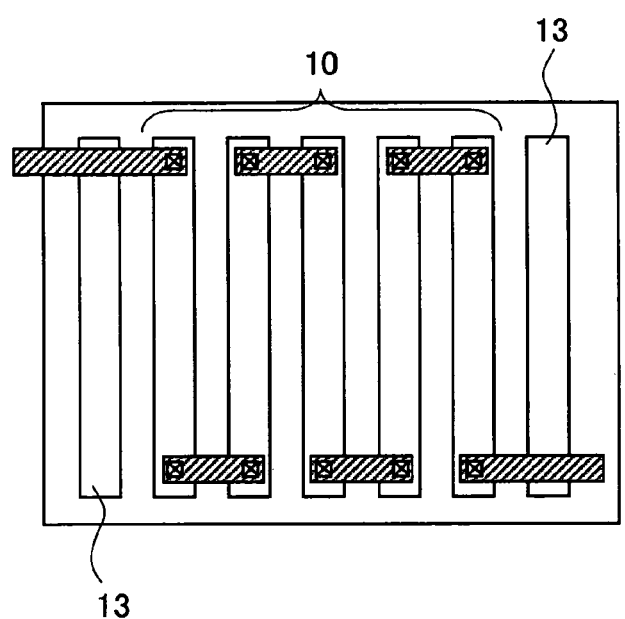
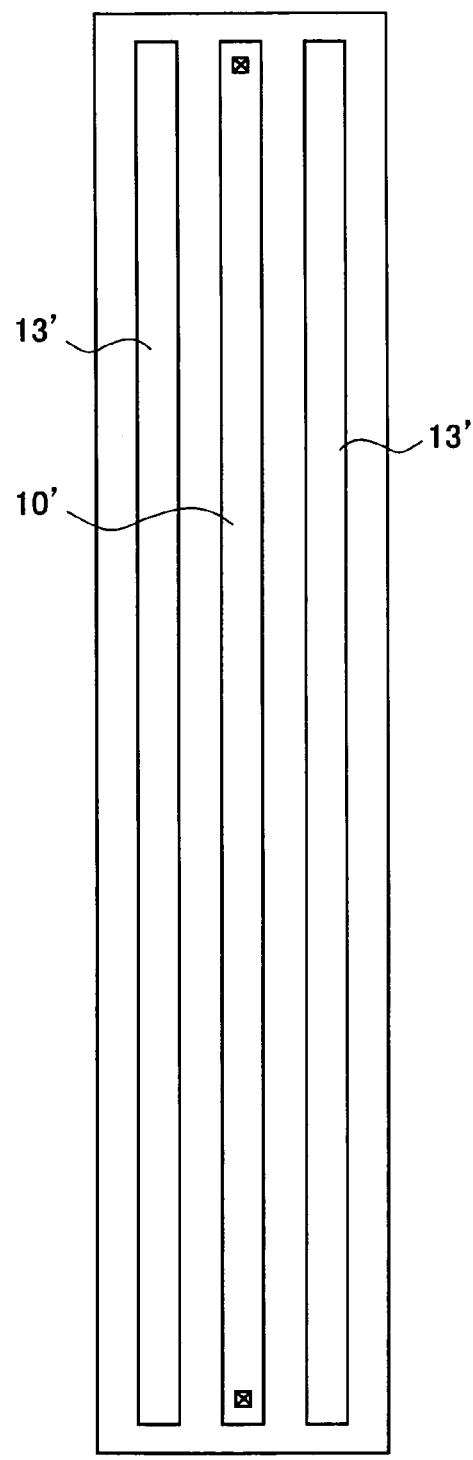

WHEN NOT DIVIDED

WHEN DIVIDED
$Cp=Cp1+Cp2+\cdots+Cpn$

US 7,304,542 B2

PHOTO-RECEIVING AMPLIFIER ELEMENT, OPTICAL PICKUP UNIT, AND OPTICAL DISK DEVICE

This Nonprovisional application claims priority under 35 U.S.C. § 119(a) on Patent Application No. 210041/2004 filed in Japan on Jul. 16, 2004, the entire contents of which are hereby incorporated by reference.

FIELD OF THE INVENTION

This invention relates to an optical pickup unit used for reading out a signal from an optical disk recording medium, and a photo-receiving amplifier element used in an optical disk device.

BACKGROUND OF THE INVENTION

Conventionally, an optical disk has widely been used as a recording medium recording audio, video, document data, or other form of information. In addition, various optical disk devices for reproducing or recording information from or in optical disks have been developed. In the optical dick device, an optical pickup unit used for signal input or signal output for an optical disk constitutes a main component of the optical disk device.

FIG. 10 is a side view that schematically illustrates a structure of an ordinary optical pickup unit. An optical pickup unit 100 includes, roughly, a semiconductor laser 101, which is a light-source, a lens optical system 102, which condenses an emitted laser beam of the semiconductor laser 101 onto an optical disk 200, and a photo-receiving amplifier element 103, which receives reflected light from the optical disk 200.

The lens optical system 102 includes a prism (or a half mirror) 104, which is disposed in an optical path between the semiconductor laser 101 and the optical disk 200, and a condensing lens 105. The photo-receiving amplifier element 103 receives a laser beam emitted from the semiconductor laser 101 and reflected by the optical disk 200 and the prism 104.

The photo-receiving amplifier element 103 includes photo-receiving sections (photo diodes) each of which is divided into a plurality of photo-receiving regions, as shown in FIG. 11. In the configuration example in FIG. 11, focusing and data signal read out are carried out by a main photo-receiving section (regions A-D) 201 that is disposed in the middle and is divided into four regions. Tracking is carried out by sub photo-receiving sections (regions E-H) 201 that are disposed on the right side and left side of the main photo-receiving section. An amplifier circuit is connected to each of these photo-receiving sections.

FIG. 13 illustrates an equivalent circuit block in an amplifier circuit of the photo-receiving amplifier element 103. In FIG. 13, the photo-receiving section 301 corresponds to each of regions A-D in the main photo-receiving section 201, and regions E-H in the sub photo-receiving section 202. In the photo-receiving section 301, a received laser beam signal is converted into a current signal, and the current signal is outputted as current signal Isc. The current signal Isc is converted into a voltage and amplified by a first-stage amplifier A11 and resistor R11 making up a first-stage amplifier unit (including a feedback circuit). The output voltage is further amplified by an amplifier A12 and resistors R12, R13, and R14 of the next stage, and is outputted as a signal from an output terminal 302.

Examples of optical disk recording media include: CD, which employs an infrared laser and is mainly used for recording audio/text data; DVD, which employs an infrared laser and is mainly used for recording video data; and BD (Blue-ray Disk), which employs a blue laser to accommodate movement toward large data capacity as in digital broadcasting in the future.

The fundamental signal frequencies of the respective optical disks are 720 kHz for CD, 4.5 MHz for DVD, and 16.5 MHz for BD, substantiating the movement toward large data capacity (smaller recording pit). Further, with the movement toward faster response speed (reading and writing) in optical disk devices, faster response characteristics are also required for a photo-receiving amplifier element employed in an optical pickup unit. As an overview, the response frequency characteristics required for a photo-receiving amplifier element are 150 MHz for 16-times read out speed in DVD, and 200 MHz or greater for 4-times read out speed in BD.

In the photo-receiving amplifier element illustrated in FIG. 13, the frequency response characteristics are essentially restricted by the characteristics of the first-stage amplifier unit including the first stage amplifier A11 and the resistor R11. Thus, in order to obtain high-speed response characteristics in a photo-receiving amplifier element, it is necessary that the first-stage amplifier be speeded-up.

One method of increasing the speed of the first stage amplifier unit is to increase the speed of the respective elements of the first-stage amplifier unit by modifying the fabrication process of an integrated circuit, so as to increase the open-loop gain of the first-stage amplifier A11. Another method is to decrease the resistance of R11, which is a feedback resistor, and thereby increase the speed and band of the first-stage amplifier unit. Both of these methods are based upon the concept of the GB (gain-bandwidth) product, a relationship between gain and bandwidth.

The former method in which the respective elements are speeded up has a problem of requiring a long development period and huge costs for modifying the fabrication process of integrated circuits.

On the other hand, the latter method in which the resistance of the feedback resistor R11 is decreased has the following problem. Because the resistance of the feedback resistor R11 determines the sensitivity (photo-electronic signal conversion rate) of the photo-receiving amplifier element, the resistance of the feedback resistor R11 is set according to the optical design of the pickup and cannot be freely set in accordance with response frequency.

More specifically, the feedback resistor R11 in FIG. 13 converts photocurrent from the photo-receiving section 301 into a voltage signal, and predominantly decides the response characteristic of the photo-receiving amplifier element based on the product of gain and bandwidth. Because such photo-receiving amplifier element is usually formed on a single substrate by a semiconductor process, active elements such as transistors, and other elements such as resistors and capacitors are separately formed on an island (epitaxial layer) via junctions. As illustrated in FIG. 14, feedback resistors and other resistors are formed on the same island.

Integrated circuits inherently include a p-n junction for separating elements. As such, a parasitic resistance and/or parasitic capacitance is added to the respective elements. FIG. 15 shows an example of a structure of a resistor portion that is formed by a semiconductor process. In this example, an N-type epitaxial layer 402 is formed on a silicon substrate 401, and a polysilicon film 404 patterned into a resistor portion is formed thereon with a SiO$_2$ film 403 in between. In addition, a SiO$_2$ film 405 is formed on the polysilicon film 404. In this structure, capacitors C1 are formed between the polysilicon film 404 and the N-type epitaxial layer 402 with the SiO$_2$ film 403 as a dielectric, and capacitors C2 are formed along the junction of the N-type epitaxial layer 402 and the silicon substrate 401. Here, the capacitors C1 and C2 serially provide a parasitic capacitance Cp against the resistor.

With the parasitic capacitance Cp added as a distributed constant circuit, the feedback resistor R11 is equivalently represented as shown in FIG. 16. Here, the feedback resistor R11 has a structure (characteristics) of an integrator due to the influence of the parasitic capacitance Cp, and the response frequency of the integrator is expressed as $1/(2\pi \cdot R \cdot Cp)$. In this manner, the feedback resistor portion in the first-stage amplifier unit is caused to have characteristics of an integrator (low pass). This limits the response frequency of the first-stage amplifier unit, making it difficult to increase the speed of the first-stage amplifier unit.

SUMMARY OF THE INVENTION

An object of the present invention is to achieve high response in a photo-receiving amplifier element without accompanying any process change in the circuit or change in the resistance value of a feedback resistor in a first-stage amplifier unit.

In order to achieve the above object, a photo-receiving amplifier element of the present invention includes a feedback circuit. The feedback circuit includes a feedback resistor formed on an island region whose electric potential is in a floating state. The island region on which the feedback resistor is formed is electrically isolated from an island region on which an element other than the feedback resistor is formed.

In the photo-receiving amplifier element, the island region on which the feedback resistance is formed is electrically separated from the island region on which other elements are formed, and has a floating electric potential. This reduces the parasitic capacitance generated in the feedback resistor, and therefore response characteristics of the photo-receiving amplifier element can be improved.

Further objects, features, and merits of the present invention should be well understandable by the following description. In addition, advantages of the present invention should be clear with the following description with reference to the attached drawings.

BRIEF DESCRIPTION OF THE DRAWINGS

FIG. 2(*a*) and FIG. 2(*b*) are plan views showing structures of a feedback resistor section with dummy resistors, in which FIG. 2(*a*) illustrates a structure in which divided feedback resistors are disposed, and FIG. 2(*b*) illustrates a structure in which the feedback resistor is not divided.

DESCRIPTION OF THE EMBODIMENTS

Figure 1:
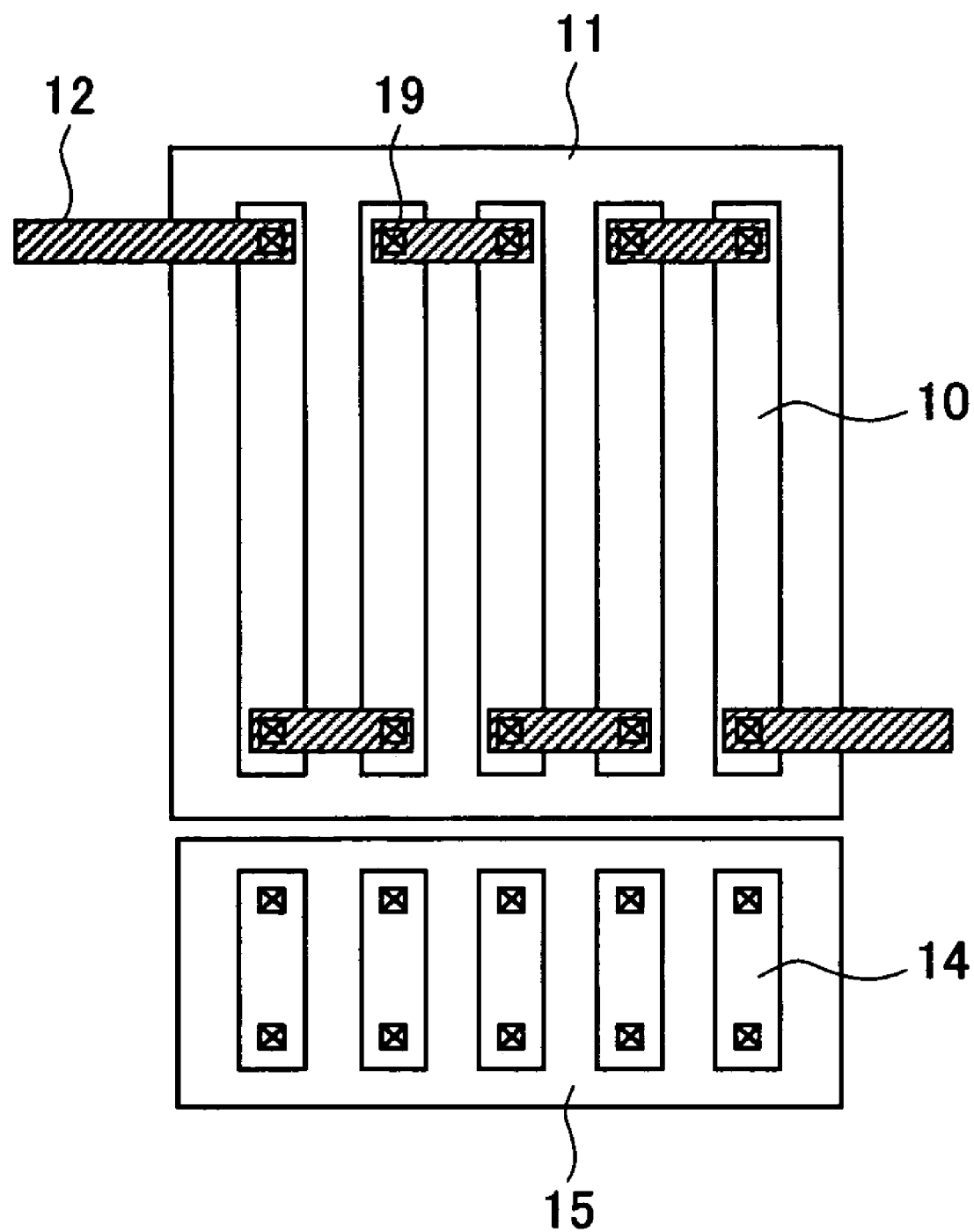
FIG. 1 is a plan view showing an example of a structure of a feedback resistor section in a photo-receiving amplifier element according to one embodiment of the present invention.
Figure 9:
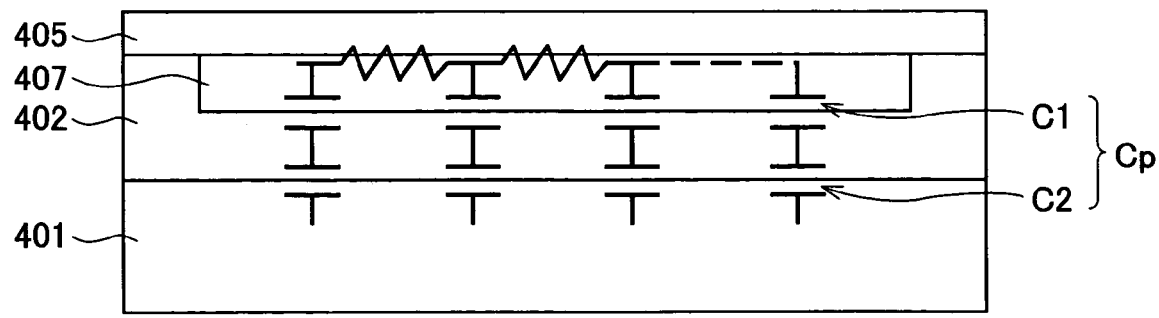
FIG. 9 is a cross sectional view showing another structure of the resistor section in the photo-receiving amplifier element.
Figure 13:
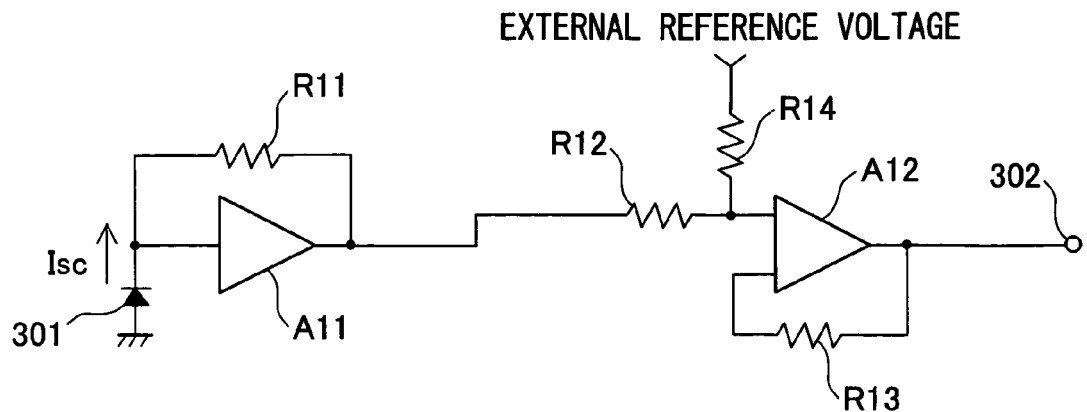
FIG. 13 is a circuit diagram showing an example of a structure of an amplifier circuit to be connected to the respective photo-receiving sections in a photo-receiving amplifier element.

Following will describe an embodiment of the present invention, with reference to FIG. 1 or FIG. 9. It should be noted first that a photo-receiving amplifier element according to the present embodiment has the same amplifier circuit structure as the one shown in FIG. 13. In other words, the present invention increases the response speed of a photo-receiving amplifier element by reducing a parasitic capacitance generated in a feedback resistor of a first-stage amplifier unit, without modifying the conventional integrated circuit fabrication process. Note also that the circuit structure shown in FIG. 13 is merely an exemplary structure of the photo-receiving amplifier element in its simplest form, and the circuit structure of the photo-receiving amplifier element of the present invention is not limited to the example shown in FIG. 13. In other words, a photo-receiving amplifier element according to the present invention can have any structure as long as it includes a first-stage amplifier unit having at least a feedback circuit.

FIG. 1 is a plan view that illustrates an example of a structure of a feedback resistor section in a photo-receiving amplifier according to the present embodiment. In the photo-receiving amplifier element, an island 11 under the feedback resistor 10 of the first stage amplifier unit is formed separately from an island lying under other resistors. In addition, the island 11 under the feedback resistor 10 has a floating potential instead of a fixed potential. Referring to the structure shown in FIG. 15, the island 11 under the feedback resistor 10 is formed by the N-type epitaxial layer 402, and is separated from the other islands usually by a P-type isolation diffusion, a trench oxide film, or other ordinary methods.

The feedback resistor 10 is made from a polysilicon film divided into a plurality of regions, and these polysilicon films are connected to one another with metal leads 12 via contacts 19, so as to function as a single resistor.

With the island 11 under the feedback resistor 10 of the first-stage amplifier unit separately provided from the island lying under other resistors, the photo-receiving amplifier element can reduce a junction capacitance C2 generated in the island 11. This is a direct consequence of the reduced junction area between the N-type epitaxial layer 402, which forms the island 11, and the silicon substrate 401 (see FIG. 15). As a result, the capacitance that results from the serial capacitance of the junction capacitance C2 and silicon oxide film capacitance C1, namely a parasitic capacitance Cp added to the feedback resistor can be reduced. Further, setting a floating potential for the island 11 under the feedback resistor 10 is advantageous in reducing the overall parasitic capacitance, including the serial capacitance of C1 and C2.

Figure 14:
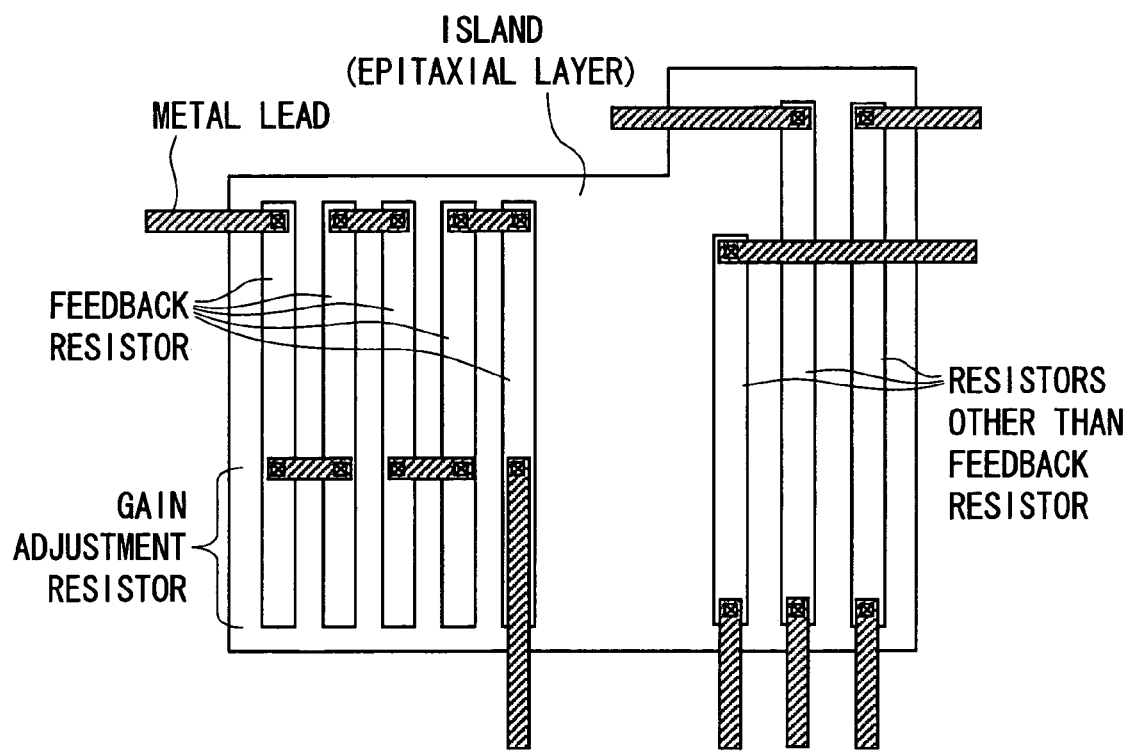
FIG. 14 is a plan view showing an example of a structure of a feedback resistor section in a conventional photo-receiving amplifier element.

For example, in the conventional structure illustrated in FIG. 14, Cp is 33.3 fF when the resistance R of the feedback resistor is 30 kΩ, and when C1=50 fF and C2=100 fF. Then, the response frequency of the integrator including the feedback resistance R and the parasitic capacitance Cp becomes:

$$1/(2\pi \cdot R \cdot Cp) \approx 159 \text{ MHz}$$

On the other hand, in the structure shown in FIG. 1, Cp=25 fF when C2=50 fF and the same values of R and C1 are maintained. Similarly, the response frequency becomes:

$$1/(2\pi \cdot R \cdot Cp) \approx 212 \text{ MHz}$$

With such a frequency characteristic, 4-times read out of BD can be accommodated.

As mentioned above, in the photo-receiving amplifier element, the junction area between the N-type epitaxial layer 402 forming the island 11 and the silicon substrate 401 is decreased so as to reduce the junction capacitance C2, with the result that the response frequency of the photo-receiving amplifier element is improved. In other words, in the photo-receiving amplifier element, the reduced area of the island 11 improves response frequency.

In order to reduce the area of the island 11, it is effective to structure the feedback resistance 10 from a polysilicon film that has been divided into a plurality of regions. Specifically, the island 11 under the feedback resistor 10 is formed with a predetermined margin region around the feedback resistor 10, and the margin region on the island 11 can be reduced by dividing the feedback resistor 10 into a plurality of regions. In other words, by being divided into a plurality of regions, the feedback resistor 10 can be arranged with such a minimum design rule as to minimize the area of the island 11, while obtaining a desired resistance value.

Generally, resistors requiring accuracy such as the feedback resistor include dummy patterns, which are disposed on both ends of the resistor to reduce the influence of loading effect in dry etching, for example. FIG. 2(a) and FIG. 2(b) compare layouts of such dummy patterns, in which FIG. 2(a) illustrates dummy patterns 13 arranged on the both sides of the feedback resistor 10 divided into five parts, and FIG. 2(b) illustrates dummy patterns 13' arranged on the both sides of a feedback resistor 10' that is not divided. The proportion of dummy patterns in the area of the island under the undivided feedback resistor is greater than that under the divided feedback resistor. Consequently, the area of the island under the feedback resistance is increased.

For example, assume that the feedback resistor initially has a resistor width of 5 μm and a resistor length of 500 μm, that a resistor interval is 3 μm, and that a distance between the resistor and an edge of an island is 1 μm. In this case, the area of the island in the layout shown in FIG. 2(a) becomes 55×102=5610 μm², and that in the layout shown in FIG. 2(b) becomes 23×502=11546 μm². Therefore, the area of the island with the layout shown in FIG. 2(b) is about two times greater than that of the layout shown in FIG. 2(a). In other words, in the present invention, the parasitic capacitance C2 can be further reduced by dividing the feedback resistor as in the layout shown in FIG. 2(a), particularly in the layout with the dummy patterns.

Further, in the structure illustrated in FIG. 1, a gain adjustment resistor 14 is disposed separately from the main body of the feedback resistor (that is, the feedback resistor 10). The gain adjustment resistor 14 is formed on an island 15 different from the one on which the feedback resistor 10 is formed. This gain adjustment resistor 14 is disposed so as to optimize the resistance value of the feedback resistor based upon the test result of a prototype photo-receiving amplifier element.

In the conventional layout illustrated in FIG. 14, the gain is adjusted by changing the positions of contacts for the main body of the feedback resistor. Therefore, the feedback resistor has an extra length including the gain-adjustment-resistor section. In this structure, the parasitic capacitance is also added to the gain-adjustment-resistor section that is not actually used as a resistor. As a result, a large parasitic capacitance is generated.

Figure 3:
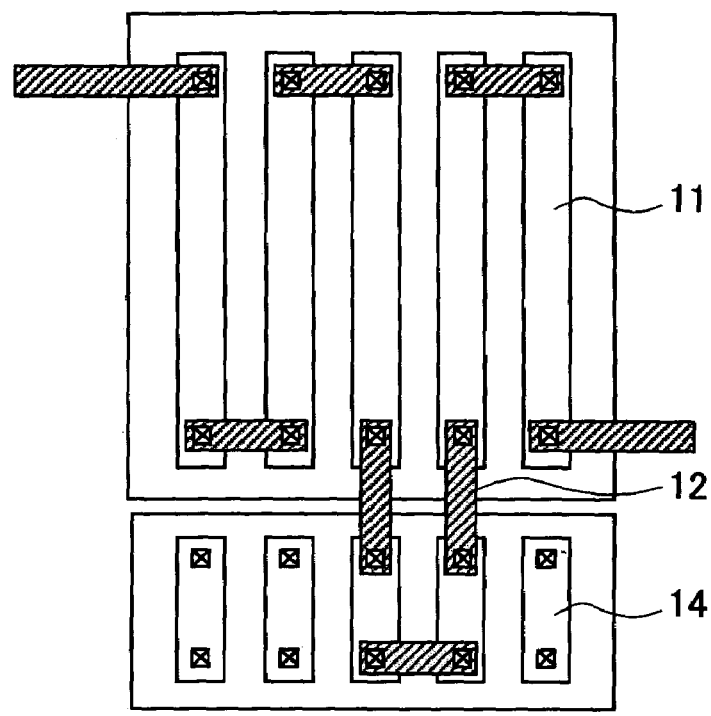
FIG. 3 is a plan view of the feedback resistor section illustrated in FIG. 1, in which gain adjustment is carried out.

On the contrary, in the structure illustrated in FIG. 1, the gain adjustment resistor 14 is separately provided from the feedback resistor 10. In addition, the island 15 lying underneath is separated from the island 11 on which the feedback resistor 10 is formed. Therefore, a greater parasitic capacity reducing effect can be expected as compared with the conventional structure. When gain adjustment is needed in the structure in FIG. 1, it is carried out by connecting the feedback resistor 10 to the gain adjustment resistor 14 with the metal leads 12, as shown in FIG. 3.

Figure 4:
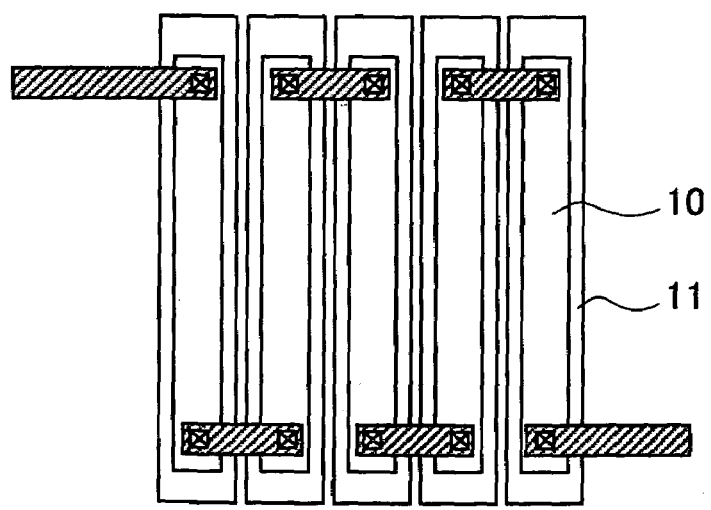
FIG. 4 is a plan view showing another example of a structure of the feedback resistor section in the photo-receiving amplifier element.
Figure 12:
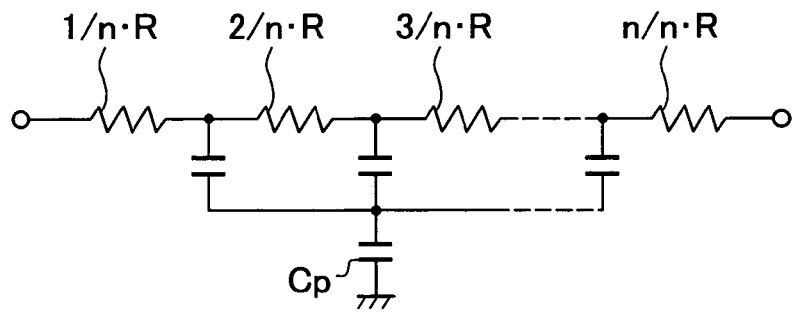
FIG. 12(*a*) is an equivalent circuit of a feedback resistor in the case in which an island under the feedback resistor is not divided, and FIG. 12(*b*) is an equivalent circuit of a feedback resistor in the case in which an island under the feedback resistor is divided.
Figure 12:
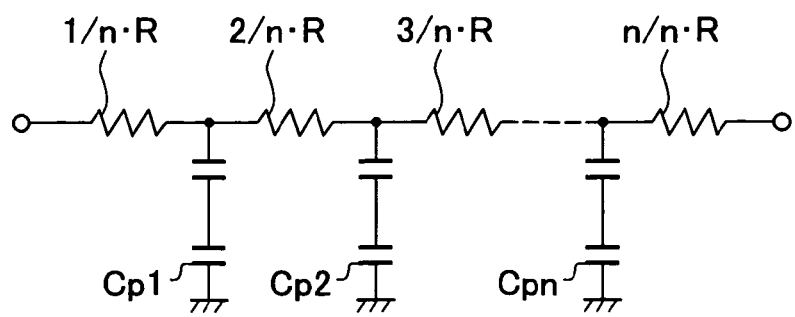

Following will describe several modification examples of the present invention. In the example shown in FIG. 4, the feedback resistor 10 is divided into a plurality of parts. In addition, the island 11 under the feedback resistors 10 is also divided to match the feedback resistors 10. With such a layout pattern, the value of the parasitic capacitance C2 of each of the divided island parts will have a value obtained by simple division (⅕ in the example of FIG. 4). FIG. 12(a) and FIG. 12(b) show equivalent circuits, in which FIG. 12(a) illustrates the case where the island 11 under the feedback resistor 10 is not divided, and FIG. 12(b) illustrates the case where the island 11 is not divided. By thus dividing the island 11 under the feedback resistor 10 to match the number of divided resistors, the parasitic capacitance generated in the feedback resistor 10 can be reduced more.

Figure 5:
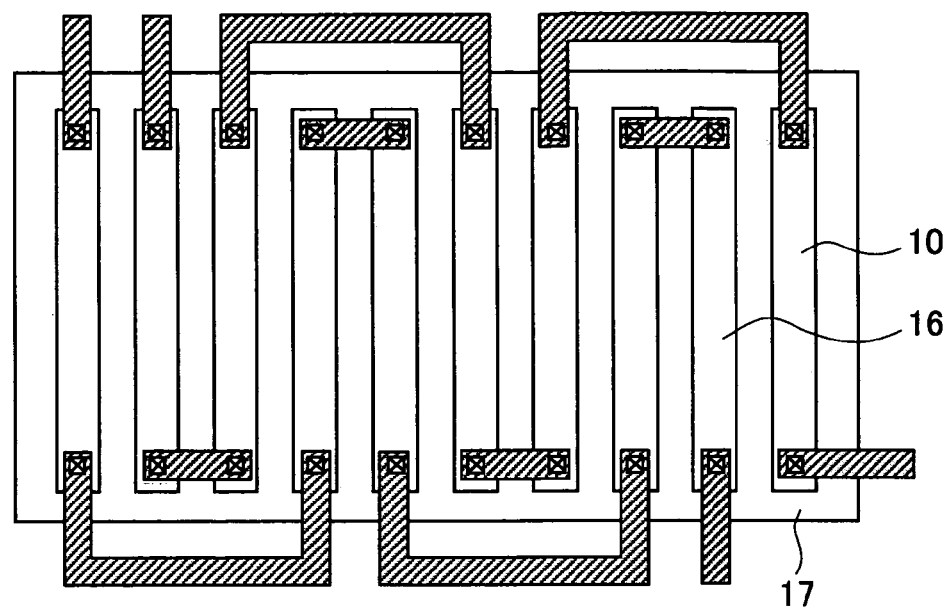
FIG. 5 is a plan view showing yet another example of a structure of the feedback resistor section in the photo-receiving amplifier element.

In addition, in the example shown in FIG. 5, the feedback resistor 10 of the first-stage amplifier unit and the feedback resistor 16 of the reference circuit are divided into a plurality of resistors and are alternately disposed. The resistors altogether are formed on a separated island 17 with a minimum design rule.

Figure 6:
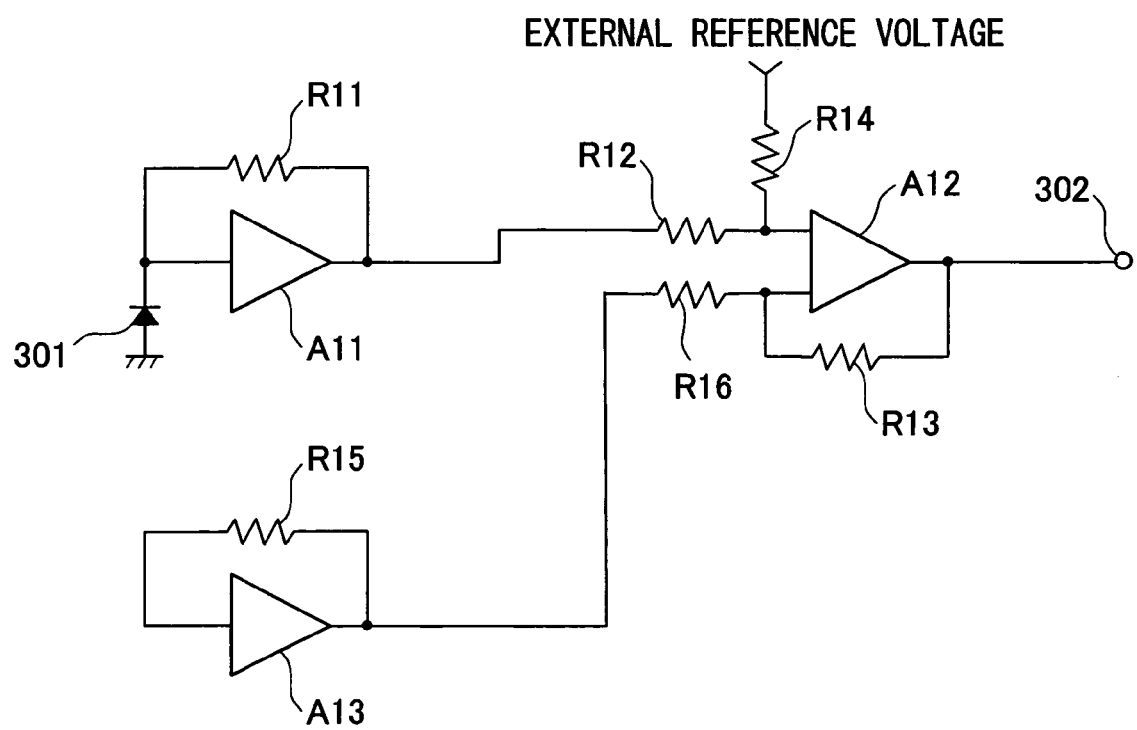
FIG. 6 is a circuit diagram showing an example of a structure of a photo-receiving amplifier element including a reference circuit.

Here, the photo-receiving amplifier element may have a reference circuit as a component other than the first-stage amplifier unit. The reference circuit also has a feedback resistor. FIG. 6 shows a structure in which a reference circuit has been added to the photo-receiving amplifier element of the structure illustrated in FIG. 13. In other words, in the photo-receiving amplifier element, the reference circuit includes the resistor R15, the resistor R16, and the amplifier A13, and the resistor R15 becomes the feedback resistor 16 in the reference circuit (see FIG. 5).

In the case where the photo-receiving amplifier element includes a reference circuit, the feedback resistor 16 in this reference circuit is required to be in conformity with the feedback resistor 10. Therefore, it is necessary that the feedback resistor 16 be disposed in the neighborhood of the feedback resistor 10 and adjacent thereto. Thus, with the layout illustrated in FIG. 5, the parasitic capacitance of the feedback resistor can be reduced even in the photo-receiving amplifier element including the reference circuit. As a result, a high-speed photo-receiving amplifier element can be obtained. In the layout illustrated in FIG. 5, the structure in which the feedback resistor 10 and the feedback resistor 16 are alternately disposed is for maintaining a conformance between the feedback resistor 10 and the feedback resistor 16.

Figure 7:
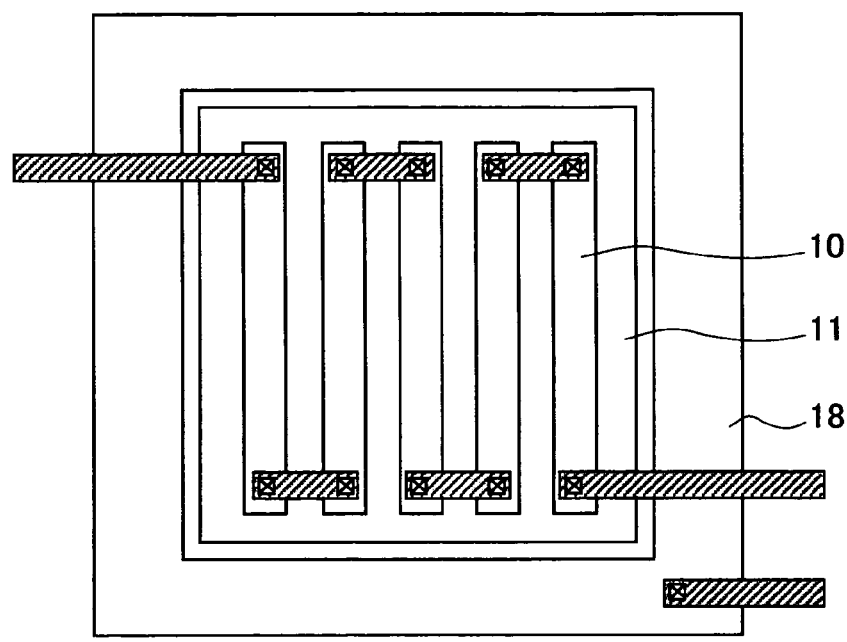
FIG. 7 is a plan view showing another example of a structure of the feedback resistor section in the photo-receiving-amplifier element.

Further, in the example shown in FIG. 7, a dummy island region 18 fixed at constant electric potential (for example, ground potential) is disposed around an electrically isolated floating island 11 formed under the feedback resistor 10.

In the photo-receiving amplifier element provided with an island whose electric potential is in a floating state, an error tends to occur as a result that an optical carrier generated at the time when light enters a photo diode reaches the island whose electric potential is in a floating state. On the other hand, with the structure as shown in FIG. 7 in which the dummy island region 18 of a constant potential is disposed around the island 11 whose electric potential is in a floating state, the optical carrier that has reached the island 11 whose electric potential is in a floating state is absorbed by the dummy photo diode formed between the dummy island region 9 and the substrate. Therefore, occurrence of errors can be suppressed.

The structures of modification examples shown in FIG. 4 through FIG. 7 can be freely combined to be implemented in a photo-receiving amplifier element according to the present invention.

Figure 15:
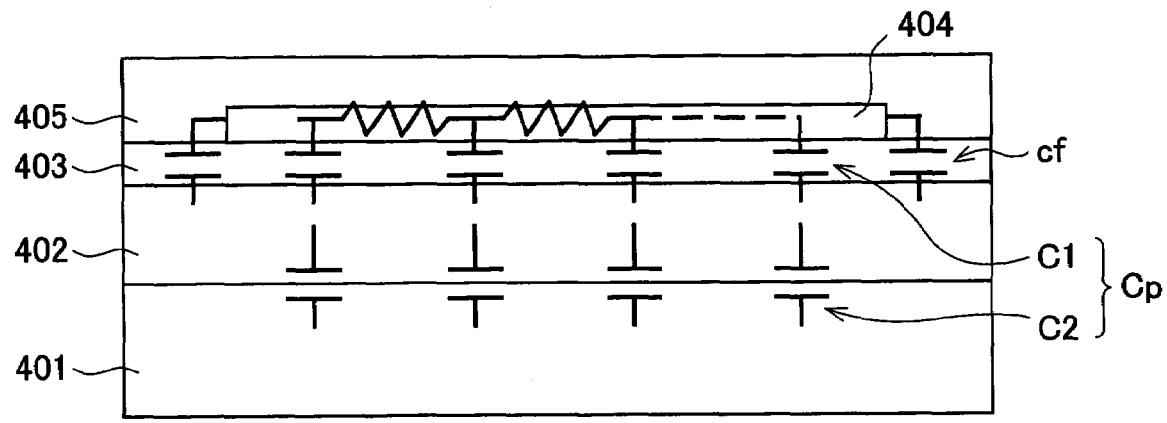
FIG. 15 is a cross sectional view illustrating an example of a structure of a resistor section in a photo-receiving amplifier element.
Figure 16:
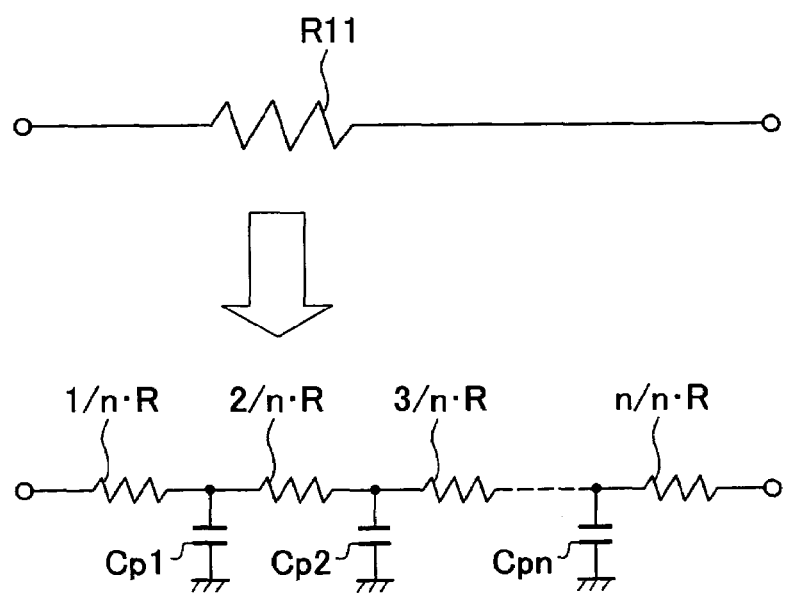
FIG. 16 is an equivalent circuit in which a parasitic capacitance has been added to the feedback resistor in a photo-receiving amplifier element.

The cross section structure of the feedback resistor 10 portion in a photo-receiving amplifier element in accordance with the embodiments can basically have the same structure as that illustrated in FIG. 15. However, the parasitic capacitances C1 and C2 can be reduced and the parasitic capacitance reducing effect can be further improved by implementing any combination of the following structure modifications.

(1) The film thickness of the silicon oxide film 403 (usually about 0.5 μm to 0.7 μm) under the feedback resistor 10 is increased (preferably to 1 μm or more), and thereby reduce the parasitic capacitance C1.

(2) Instead of the silicon oxide film, a low dielectric constant material (preferably a material with a dielectric constant less than 3.9), such as porous silica material, is used as a material of the film under the feedback resistor 10, and thereby reduce the parasitic capacitance C1.

(3) The resistivity of the silicon substrate 401, which is usually about 10 Ωcm, is increased (preferably to 20 Ωcm or more), and thereby reduce the junction capacitance between the silicon substrate and the epitaxial layer, with the result that the parasitic capacitance C2 is reduced.

(4) The film thickness of a polysilicon film 404 (usually about 0.3 μm to 0.5 μm) that forms the feedback resistor 10 is reduced (preferably to 0.2 μm or less), and thereby reduce the parasitic capacitance Cf that is added to the side face of the polysilicon film 404, with the result that the parasitic capacitance C1 is reduced.

(5) The sheet resistance of the polysilicon film 404 forming the feedback resistor 10 is increased from the normal range of 1 to 3 kΩ/□ (preferably 5 kΩ/□ or more), and thereby reduce the area of the feedback resistor 10, with the result that C1 is reduced.

(6) A SOI (Silicon On Insulator) substrate is employed as a silicon substrate 401. Under the condition in which the thickness of the oxide film used in a normal SOI substrate has a film thickness of 0.5 μm to 1.0 μm, the value of parasitic capacitance of the oxide film added is considered to be smaller than the value of junction capacitance between the N-type epitaxial layer and the P-type silicon substrate. Thus, the parasitic capacitance C2 can be reduced.

In addition, following modifications of the structure shown in FIG. 15 can be employed to further improve the parasitic capacitance reducing effect.

Figure 8:
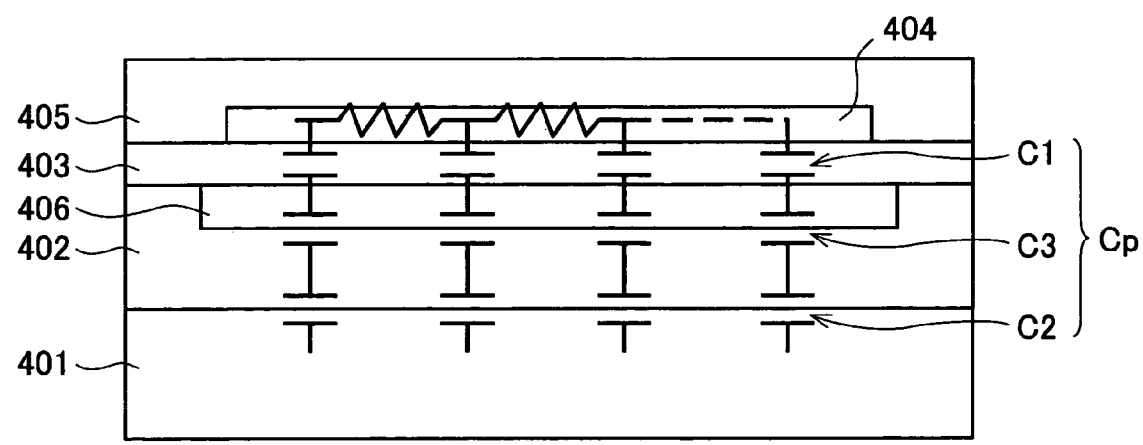
FIG. 8 is a cross sectional view showing an example of a structure of a resistor section in a photo-receiving amplifier element.

(1) As shown in FIG. 8, a P-type diffusion layer 406 is disposed in the N-type epitaxial layer 402, and the P-type diffusion layer 406 has a floating electric potential. In this way, the junction capacitance C3 generated between the N-type epitaxial layer 402 and the P-type diffusion layer 406 is also serially added, and therefore the whole parasitic capacitance can be reduced (1/Cp=1/C1+1/C2+1/C3).

(2) The feedback resistor 10 is formed of a diffusion resistor 407 instead of a polysilicon film 404 (see FIG. 9), and the resistivity of the N-type epitaxial layer 402 is increased from the normal range of about 1 Ωcm (preferably 3 Ωcm or more), with the result that the parasitic capacitance C1 is reduced.

Figure 11:
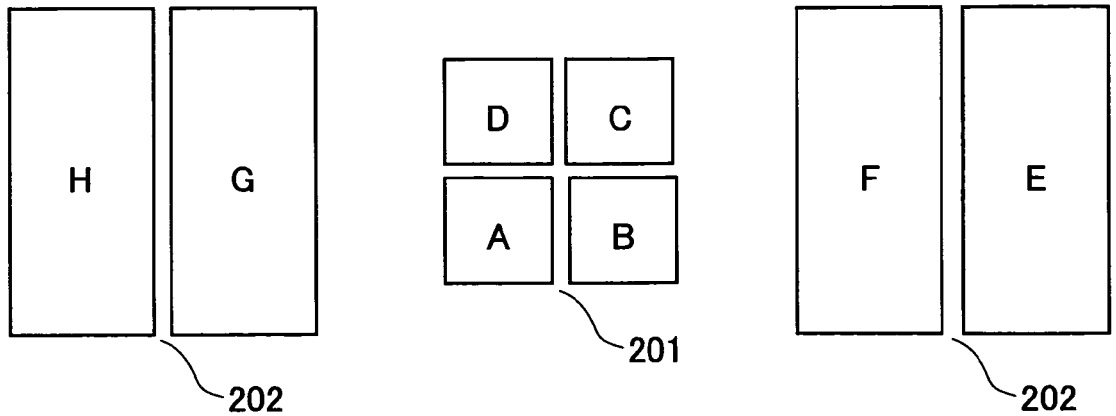
FIG. 11 is a plan view showing an example of a division pattern of a photo-receiving section in a photo-receiving amplifier element.

Further, a photo-receiving amplifier element in accordance with the present invention includes a photo-receiving section (photo diode) that is divided into a plurality of photo-receiving regions, for example as shown in FIG. 11, and the divided photo-receiving sections each include a circuit structure, for example as shown in FIG. 13 (each photo-receiving region becomes a photo-receiving section 301). As a result, a photo-receiving amplifier element in accordance with the present invention has a plurality of amplifier circuits, respectively corresponding to the divided photo-receiving sections. However, it is not necessarily required that all of the amplifier circuits have the above-mentioned structure.

In other words, a photo-receiving amplifier element in accordance with the present invention is invented to accommodate the increased basic signal frequency due to the movement toward large data capacity in the optical disk. This can be achieved if the present invention is applied to at least an amplifier circuit in the main photo-receiving section in which data signals are detected.

Figure 10:
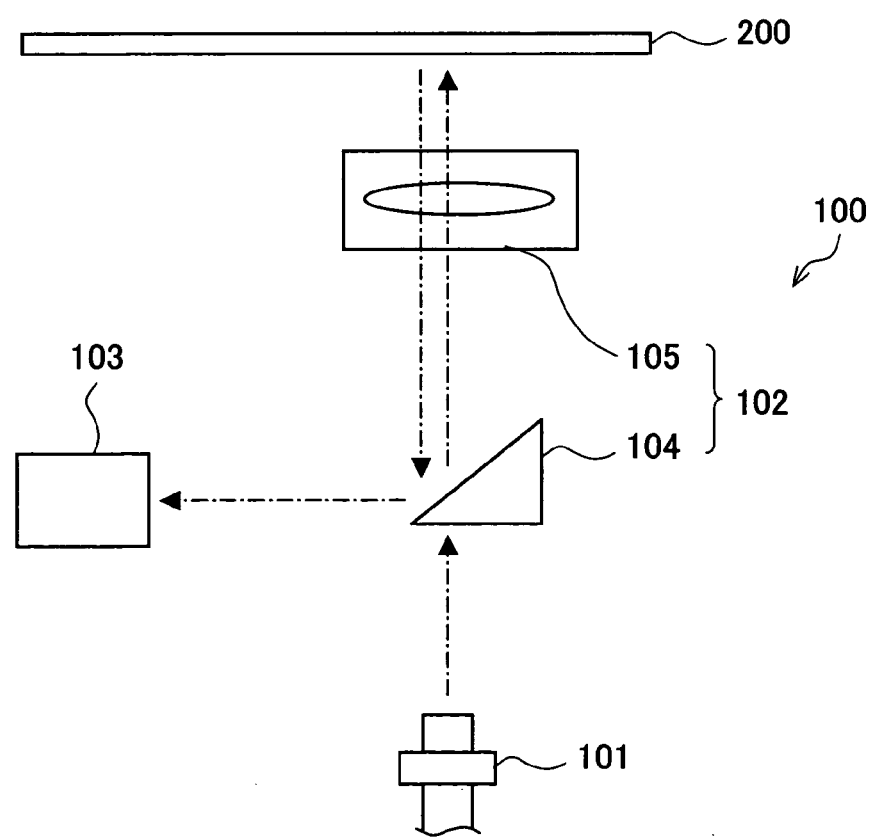
FIG. 10 is a view schematically showing a structure of an optical pickup unit.

Further, an optical pickup unit in accordance with the present invention is structured to use the photo-receiving amplifier element of the present invention instead of the photo-receiving amplifier element 103 shown, for example, in the structure illustrated in FIG. 10. The optical disk device in accordance with the present invention is constructed to use an optical pickup unit of the present invention.

As described above, the photo-receiving amplifier element of an embodiment of the invention includes a feedback circuit. The feedback circuit includes a feedback resistor formed on an island region whose electric potential is in a floating state. The island region on which the feedback resistor is formed is electrically isolated from an island region on which an element other than the feedback resistor is formed.

In this structure, the island region on which the feedback resistor is formed is electrically isolated from the island region on which other elements are formed, and has a floating electric potential. In this way, the parasitic capacitance generated in the feedback resistor can be reduced, and response characteristics of the photo-receiving amplifier element can be improved.

Further, the photo-receiving amplifier element may be adapted to include a fine-tuning resistor for the feedback resistor. The fine-tuning resistor is formed on an electrically isolated island region different from the island region on which the feedback resistor is formed, and whose electric potential is in a floating state.

In this structure, by forming the fine-tuning resistor on a separate island region, the area of the island region on which the feedback resistance is formed can be reduced, and therefore parasitic capacitance of the feedback resistor can be further reduced. As a result, response characteristics of the photo-receiving amplifier element can be improved.

Further, the photo-receiving amplifier element may be adapted so that the feedback resistor is divided into a plurality of resistors. The plurality of resistors are disposed in such a way as to minimize an area of the island region on which the resistors are formed.

In this structure, by being divided into a plurality of regions, the feedback resistor can be arranged with such a minimum design rule as to minimize the area of the island region, while obtaining a desired resistance value. As a result, parasitic capacitance of the feedback resistor can be further reduced, and therefore response characteristics of the photo-receiving amplifier element can be improved.

Among the parasitic capacitance generated in the feedback resistor, the junction capacitance generated in proportion to the area of the junction portion between a substrate (for example, a silicon substrate) on which the photo-receiving amplifier element is formed and the island region can be reduced in accordance with the number of divided island region. As a result, the parasitic capacitance of the feedback resistor can be reduced, and therefore response characteristics of the photo-receiving amplifier element can be improved.

Further, the photo-receiving amplifier element may be adapted so that a dummy island region of a constant potential is disposed around the island region on which the feedback resistor is formed.

In the photo-receiving amplifier element provided with an island whose electric potential is in a floating state, an error tends to occur as a result that an optical carrier generated at the time when light enters a photo diode reaches the island whose electric potential is in a floating state. On the other hand, with the foregoing structure in which the dummy island region of a constant potential is disposed around the island whose electric potential is in a floating state, the optical carrier that has reached the island whose electric potential is in a floating state is absorbed by the dummy photo diode formed between the dummy island region and the substrate. Therefore, occurrence of errors can be suppressed.

Further, the photo-receiving amplifier element may be adapted so that the feedback resistor is divided into a plurality of resistors. The plurality of resistors are respectively formed on electrically isolated island regions whose electric potential is in a floating state.

In this structure, Among the parasitic capacitance generated in the feedback resistor, the junction capacitance generated in proportion to the area of the junction portion between a substrate (for example, a silicon substrate) on which the photo-receiving amplifier element is formed and the island region can be reduced in accordance with the number of divided island region. As a result, the parasitic capacitance of the feedback resistor can be reduced, and therefore response characteristics of the photo-receiving amplifier element can be improved.

Further, the photo-receiving amplifier element may be adapted so that the feedback resistor formed on the island region includes alternately disposed feedback resistors for a reference circuit and a signal processing circuit.

In the case in which the photo-receiving amplifier element includes a reference circuit, it is necessary that the feedback resistor of the reference circuit and the feedback resistor of the signal processing circuit be adjacently disposed. In the above-mentioned structure, the parasitic capacitance of the feedback resistance can be reduced also in the photo-receiving amplifier element including a reference circuit. Therefore, response characteristic of the photo-receiving amplifier element can be improved.

Further, the photo-receiving amplifier element may be adapted so that the island region on which the feedback resistor is formed is formed of an N-type epitaxial layer formed on a silicon substrate. The feedback resistor is formed of a resistor film formed on the N-type epitaxial layer with a dielectric film disposed in between.

Further, in the photo-receiving amplifier element, it is preferable that the dielectric film under the feedback resistor have a film thickness of 1 μm or greater.

In this structure, among the parasitic capacitance generated in the feedback resistor, the insulating-film capacitance generated between the resistor film forming the feedback resistor and the N-type epitaxial layer forming the island region can be reduced. As a result, the parasitic capacitance of the feedback resistor is reduced, and therefore response characteristics of the photo-receiving amplifier element can be improved.

Further, in the photo-receiving amplifier element, it is preferable that the dielectric film under the feedback resistor have a relative permittivity of less than 3.9.

In this structure, among the parasitic capacitance generated in the feedback resistor, the insulating-film capacitance generated between the resistor forming the feedback resistor and the N-type epitaxial layer forming the island region can be reduced. As a result, the parasitic capacitance of the feedback resistor is reduced, and therefore response characteristics of the photo-receiving amplifier element can be improved.

Further, in the photo-receiving amplifier element, it is preferable that the silicon substrate have a resistivity of 20 Ωcm or greater.

In this structure, among the parasitic capacitance generated in the feedback resistor, the junction capacitance generated between the silicon substrate and the N-type epitaxial layer can be reduced. As a result, the parasitic capacitance of the feedback resistor is reduced, and therefore response characteristics of the photo-receiving amplifier element can be improved.

Further, in the photo-receiving amplifier element, it is preferable that the silicon substrate include a SOI (Silicon On Insulator) substrate.

Further, in the photo-receiving amplifier element, it is preferable that the resistor film forming the feedback resistor have a film thickness of 0.2 μm or less.

In this structure, among the parasitic capacitance generated in the feedback resistor, the parasitic capacitance added to the side face of the resistor film can be reduced, and therefore response characteristics of the photo-receiving amplifier element can be improved.

Further, in the photo-receiving amplifier element, it is preferable that the resistor film forming the feedback resistor have a sheet resistance of 5 KΩ/□ or greater.

In this structure, the area of the feedback resistor can be reduced. In addition, among the parasitic capacitance generated in the feedback resistor, the insulating-film capacitance generated between the resistor forming the feedback resistor and the N-type epitaxial layer forming the island region can be reduced. As a result, the parasitic capacitance of the feedback resistor can be reduced, and therefore response characteristics of the photo-receiving amplifier element can be improved.

Further, the photo-receiving amplifier element may be adapted so that the N-type epitaxial layer includes a P-type diffusion layer.

In this structure, by further providing a P-type diffusion layer in the N-type epitaxial layer, the junction capacitance generated between the N-type epitaxial layer and the P-type diffusion layer is further added serially to the parasitic capacitance generated in the feedback resistor. As a result, the whole parasitic capacity can be reduced, and therefore response characteristics of the photo-receiving amplifier element can be improved.

Further, the photo-receiving amplifier element may be adapted so that the island region on which the feedback resistor is formed is formed of an N-type epitaxial layer provided on a silicon substrate. The feedback resistor is formed of a diffusion resistor formed in the N-type epitaxial layer. The N-type epitaxial layer has a resistivity of 3 Ωcm or greater.

In this structure, the feedback resistor is formed with the diffusion resistor instead of the resistor film, and the resistivity of the N-type epitaxial layer is increased to 3 Ωcm or more. In this way, among the parasitic capacitance generated in the feedback resistor, the junction capacitance (p-n junction) generated between the N-type epitaxial layer and the diffusion resistor can be reduced. As a result, the parasitic capacitance of the feedback resistor can be reduced, and therefore response characteristics of the photo-receiving amplifier element can be improved.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A photo-receiving amplifier element comprising a feedback circuit, wherein:
    said feedback circuit includes a feedback resistor formed on an island region whose electric potential is in a floating state; and
    the island region on which said feedback resistor is formed is electrically isolated from an island region on which an element other than said feedback resistor is formed.

2. The photo-receiving amplifier element as set forth in claim 1, further comprising:
    a gain adjustment resistor for said feedback resistor,
    wherein said gain adjustment resistor is formed on an electrically isolated island region different from the island region on which said feedback resistor is formed, and whose electric potential is in a floating state.

3. The photo-receiving amplifier element as set forth in claim 1, wherein:
    said feedback resistor is divided into a plurality of resistors; and
    the plurality of resistors are disposed in such a way as to minimize an area of the island region on which the resistors are formed.

4. The photo-receiving amplifier element as set forth in claim 1, wherein a dummy island region of a constant potential is disposed around the island region on which said feedback resistor is formed.

5. The photo-receiving amplifier element as set forth in claim 1, wherein:
    said feedback resistor is divided into a plurality of resistors; and
    the plurality of resistors are respectively formed on electrically isolated island regions whose electric potential is in a floating state.

6. The photo-receiving amplifier element as set forth in claim 1, wherein a feedback resistor in a reference circuit and a feedback resistor in a signal processing circuit are alternately disposed on the island region.

7. The photo-receiving amplifier element as set forth in claim 1, wherein:
    the island region on which said feedback resistor is formed is formed of an N-type epitaxial layer formed on a silicon substrate; and
    said feedback resistor is formed of a resistor film formed on the N-type epitaxial layer via a dielectric film.

8. The photo-receiving amplifier element as set forth in claim 7, wherein the dielectric film under said feedback resistor has a film thickness of 1 μm or greater.

9. The photo-receiving amplifier element as set forth in claim 7, wherein the dielectric film under said feedback resistor has a relative permittivity of less than 3.9.

10. The photo-receiving amplifier element as set forth in claim 7, wherein said silicon substrate has a resistivity of 20 Ωm or greater.

11. The photo-receiving amplifier element as set forth in claim 7, wherein the silicon substrate comprises a SOI (Silicon On Insulator) substrate.

12. The photo-receiving amplifier element as set forth in claim 7, wherein the resistor film forming said feedback resistor has a film thickness of 0.2 μm or less.

13. The photo-receiving amplifier element as set forth in claim 7, wherein the resistor film forming said feedback resistor has a sheet resistance of 5 KΩ/□ or greater.

14. The photo-receiving amplifier element as set forth in claim 7, wherein said N-type epitaxial layer includes a P-type diffusion layer.

15. A photo-receiving amplifier element as set forth in claim 1, wherein:
    the island region on which said feedback resistor is formed is formed of an N-type epitaxial layer provided on a silicon substrate;
    said feedback resistor is formed of a diffusion resistor formed in the N-type epitaxial layer; and
    the N-type epitaxial layer has a resistivity of 3 Ωcm or greater.

16. An optical pickup unit using a photo-receiving amplifier element comprising a feedback circuit,
    wherein:

said feedback circuit includes a feedback resistor formed on an island region whose electric potential is in a floating state; and the island region on which said feedback resistor is formed is electrically isolated from an island region on which an element other than said feedback resistor is formed.

17. An optical disk device using an optical pickup unit, wherein said optical pickup unit comprises a photo-receiving amplifier element including a feedback circuit; and wherein:

said feedback circuit includes a feedback resistor formed on an island region whose electric potential is in a floating state; and the island region on which said feedback resistor is formed is electrically isolated from an island region on which an element other than said feedback resistor is formed.

\* \* \* \* \*

UNITED STATES PATENT AND TRADEMARK OFFICE
CERTIFICATE OF CORRECTION

PATENT NO.       : 7,304,542 B2
APPLICATION NO.  : 11/180710
DATED            : December 4, 2007
INVENTOR(S)      : Motohiko Yamamoto et al.

It is certified that error appears in the above-identified patent and that said Letters Patent is hereby corrected as shown below:

Title page, (30), Foreign Application Priority Data:

"July 14, 2004 (JP) 2004-210041" should read --July 16, 2004 (JP) 2004-210041--

Signed and Sealed this

Twenty-fourth Day of June, 2008

JON W. DUDAS
*Director of the United States Patent and Trademark Office*